(12) United States Patent
Cho et al.

(10) Patent No.: US 8,625,354 B2
(45) Date of Patent: Jan. 7, 2014

(54) SEMICONDUCTOR MEMORY DEVICE AND METHOD OF PROGRAMMING THE SAME

(75) Inventors: Ka Young Cho, Chungeheoungbuk-do (KR); Young Soo Park, Seoul (KR)

(73) Assignee: Hynix Semicondustor Inc., Gyeonggi-do (KR)

( * ) Notice: Subject to any disclaimer, the term of this patent is extended or adjusted under 35 U.S.C. 154(b) by 272 days.

(21) Appl. No.: 12/982,558

(22) Filed: Dec. 30, 2010

(65) Prior Publication Data

US 2011/0158000 A1    Jun. 30, 2011

(30) Foreign Application Priority Data

Dec. 31, 2009 (KR) .......................... 10-2009-0135611

(51) Int. Cl.
  *G11C 16/10*    (2006.01)
(52) U.S. Cl.
  USPC ..................................................... 365/185.22
(58) Field of Classification Search
  None
  See application file for complete search history.

(56) References Cited

U.S. PATENT DOCUMENTS

| 2005/0024943 | A1* | 2/2005 | Chen et al. ............... | 365/185.22 |
| 2007/0058446 | A1* | 3/2007 | Hwang et al. ............. | 365/185.29 |
| 2007/0159892 | A1* | 7/2007 | Kang et al. ............... | 365/185.24 |

FOREIGN PATENT DOCUMENTS

| KR | 100261525 | 7/2000 |
| KR | 100386296 | 6/2003 |

OTHER PUBLICATIONS

Notice of Allowance issued from Korean Intellectual Property Office on Oct. 24, 2011.

* cited by examiner

*Primary Examiner* — Hoai V Ho
*Assistant Examiner* — James G Norman
(74) *Attorney, Agent, or Firm* — IP & T Group LLP

(57) ABSTRACT

A semiconductor memory device includes a voltage generator configured to supply a program voltage, a sub-verification voltage, or a target verification voltage to memory cells selected during a program operation, page buffers configured to latch first data according to results from comparing threshold voltages of the selected memory cells with the sub-verification voltage and latch second data according to results from comparing the threshold voltages of the memory cells with the target verification voltage, a sub-pass check circuit configured to output a sub-pass signal in response to the first data outputted from the page buffers, a main pass check circuit configured to output a main pass signal in response to the second data outputted from the page buffers, and a control circuit configured to control whether the voltage generator supplies the sub-verification voltage and the target verification voltage in response to the sub-pass signal and the main pass signal.

13 Claims, 5 Drawing Sheets

SEMICONDUCTOR MEMORY DEVICE AND METHOD OF PROGRAMMING THE SAME

CROSS-REFERENCE TO RELATED APPLICATION

Priority to Korean patent application number 10-2009-0135611 filed on Dec. 31, 2009, the entire disclosure of which is incorporated by reference herein, is claimed.

BACKGROUND

Exemplary embodiments relate to a semiconductor memory device and a method of programming the same and, more particularly, to a program method applicable to nonvolatile memory devices.

A nonvolatile memory device, which is a kind of semiconductor memory devices, is characterized in that data stored therein is not erased even though the supply of power is stopped. Data is stored in the memory cells of a nonvolatile memory device by a program operation. The threshold voltages of the memory cells may be shifted by the program operation. The levels of threshold voltages of the memory cells are shifted according to data stored in each memory cell. A program method of storing data of two bits or more in one memory cell has been used.

In a case where data of two bits are stored in one memory cell, a shifted level of the threshold voltage is changed according to the stored data by the program operation. For example, in a case where data '11' is inputted, the threshold voltage of a memory cell may be maintained at a first level of an erase state lower than 0 V. In a case where data '10' is inputted, the threshold voltage of the memory cell may rise up to a second level higher than 0 V. In a case where data '00' is inputted, the threshold voltage of the memory cell may rise up to a third level higher than the second level. In a case where data '01' is inputted, the threshold voltage of the memory cell may rise up to the third level higher than the second level.

Meanwhile, all the threshold voltages of memory cells do not rise up to a target level precisely. Some threshold voltages may rise higher than the target level. For this reason, although the same data is stored in memory cells, threshold voltages of the memory cells are slightly different from one another and distributed within a certain range.

If a distribution of the threshold voltages of memory cells is widened in each level, it is difficult to distinguish the levels of the threshold voltages from one another. In this case, data stored in the memory cells may not be accurately read.

For this reason, in order to narrow a distribution width of the threshold voltages of memory cells, an incremental step pulse programming (ISPP) method has been proposed. The ISPP method is well known, and a detailed description thereof is omitted.

Meanwhile, with a reduction in the size of a memory cell, interference between the memory cells becomes intensified. Although the memory cells are programmed according to the ISPP method, it becomes difficult to narrow a distribution width of threshold voltages of the memory cells to a desired range. For this reason, a double verification operation using two verification voltages for each level in a verification operation for detecting the levels of threshold voltages of memory cells has been proposed.

More particularly, when selected memory cells are programmed in order to raise their threshold voltages from a first level to a second level, after programming the selected memory cells the threshold voltages of the selected memory cells are detected twice by using a target verification voltage (i.e., corresponding to the second level) and a temporary verification voltage lower than the target verification voltage. As a result of the detection, the selected memory cells may be classified into first memory cells each having a threshold voltage lower than the temporary verification voltage, second memory cells each having a threshold voltage higher than the temporary verification voltage and lower than the target verification voltage, and third memory cells each having a threshold voltage higher than the target verification voltage. If the first and second memory cells each having a threshold voltage lower than the target verification voltage are detected, the first and second memory cells are programmed again by using a program voltage higher than a program voltage used previously.

Meanwhile, when programming the first and second memory cells again, 0 V is supplied to bit lines coupled to the first memory cells, and a voltage higher than 0 V and lower than a power source voltage Vcc is supplied to bit lines coupled to the second memory cells. In this case, an increment of the threshold voltages of the second memory cells is lees in comparison to the first memory cells and can be prevented from rising higher than the target verification voltage. Consequently, the selected memory cells can be programmed so that the threshold voltages of the selected memory cells are distributed within a narrow range.

In the case of the double verification operation, two verification voltages are to be used for each verification operation. Accordingly, if memory cells are programmed according to the ISPP method using the double verification operation, the program time may be increased.

BRIEF SUMMARY

According to exemplary embodiments of this disclosure, the program time can be reduced by alternatively/selectively performing verification operations, after programming selected memory cells, according to threshold voltage levels of the memory cells.

A semiconductor memory device according to an exemplary aspect of the present disclosure comprises a memory cell array configured to comprise a plurality of memory cells, a voltage generator configured to supply a program voltage, a sub-verification voltage, or a target verification voltage to the memory cells selected during a program operation, page buffers configured to latch first data according to results from comparing threshold voltages of the selected memory cells with the sub-verification voltage and latch second data according to results from comparing the threshold voltages of the memory cells with the target verification voltage, a sub-pass check circuit configured to output a sub-pass signal in response to the first data outputted from the page buffers, a main pass check circuit configured to output a main pass signal in response to the second data outputted from the page buffers, and a control circuit configured to control whether or not the voltage generator supplies the sub-verification voltage and the target verification voltage in response to the sub-pass signal and the main pass signal.

The sub-pass check circuit may comprise a parallel pass check circuit configured to output pass signals in response to a first sub-check enable signal and the first data of the page buffers and a common pass check circuit configured to output the sub-pass signal in response to the pass signals and a second sub-check enable signal.

The parallel pass check circuit may comprise a plurality of check circuits corresponding to the page buffers. Further, each check circuit may comprise a first switching element configured to have one terminal coupled to a ground terminal and operate in response to one of the first data of the page buffers and a second switching element coupled to the other terminal of the first switching element and configured to operate in response to the first sub-check enable signal. Here, the other terminals of the second switching elements of the check circuit are interconnected.

The common pass check circuit may comprise an AND gate configured to have a first input terminal to which the second sub-check enable signal is inputted and a second input terminal to which the pass signals are and a voltage supply circuit configured to supply a power source voltage to the second input terminal in response to the second sub-check enable signal when the pass signals are in a floating state.

The main pass check circuit may comprise a parallel pass check circuit configured to output pass signals in response to a first main check enable signal and the second data of the page buffers and a common pass check circuit configured to output the main pass signal in response to the pass signals and a second main check enable signal.

The parallel pass check circuit may comprise a plurality of check circuits corresponding to the page buffers. Further, each check circuit may comprise a first switching element configured to have one terminal coupled to a ground terminal and operate in response to one the second data of the page buffers and a second switching element coupled to the other terminal of the first switching element and configured to operate in response to the first main check enable signal. Here, the other terminals of the fourth switching elements of the check circuits are interconnected.

The common pass check circuit may comprise an AND gate configured to have a first input terminal to which the second main check enable signal is inputted and a second input terminal to which the pass signals are inputted and a voltage supply circuit configured to supply a power source voltage to the second input terminal in response to the second main check enable signal when the pass signals are in a floating state.

A method of programming a semiconductor memory device according to another exemplary aspect of the present disclosure comprises performing a first program operation and a first verification operation until the threshold voltages of memory cells selected from among a group memory cells are higher than a sub-verification voltage and performing a second program operation and a second verification operation until the threshold voltages of the selected memory cells are higher than a target verification voltage. Here, the second program operation and the second verification operation are performed after all the threshold voltages of the selected memory cells become higher than the sub-verification voltage.

A method of programming a semiconductor memory device according to yet another exemplary aspect of the present disclosure comprises performing a program operation to shift threshold voltages of memory cells selected from among a group of memory cells, performing a first verification operation for comparing the threshold voltages of the selected memory cells with a sub-verification voltage and a second verification operation for comparing the threshold voltages with a target verification voltage, performing a second program operation, the first verification operation, and the second verification operation to shift the threshold voltages of the selected memory cells if there is a memory cell having a threshold voltage lower than the sub-verification voltage, from among the selected memory cells; and performing a third program operation and the second verification operation to shift threshold voltages of the selected memory cells having a threshold voltage lower than the target verification voltage if there is a memory cell having a threshold voltage lower than the target verification voltage, from among the selected memory cells, after all the threshold voltages of the selected memory cells become higher than the sub-verification voltage.

DESCRIPTION OF EMBODIMENTS

Hereinafter, exemplary embodiments of the present disclosure will be described in detail with reference to the accompanying drawings. The figures are provided to enable those of ordinary skill in the art make and use the exemplary embodiments of the disclosure.

Figure 1:
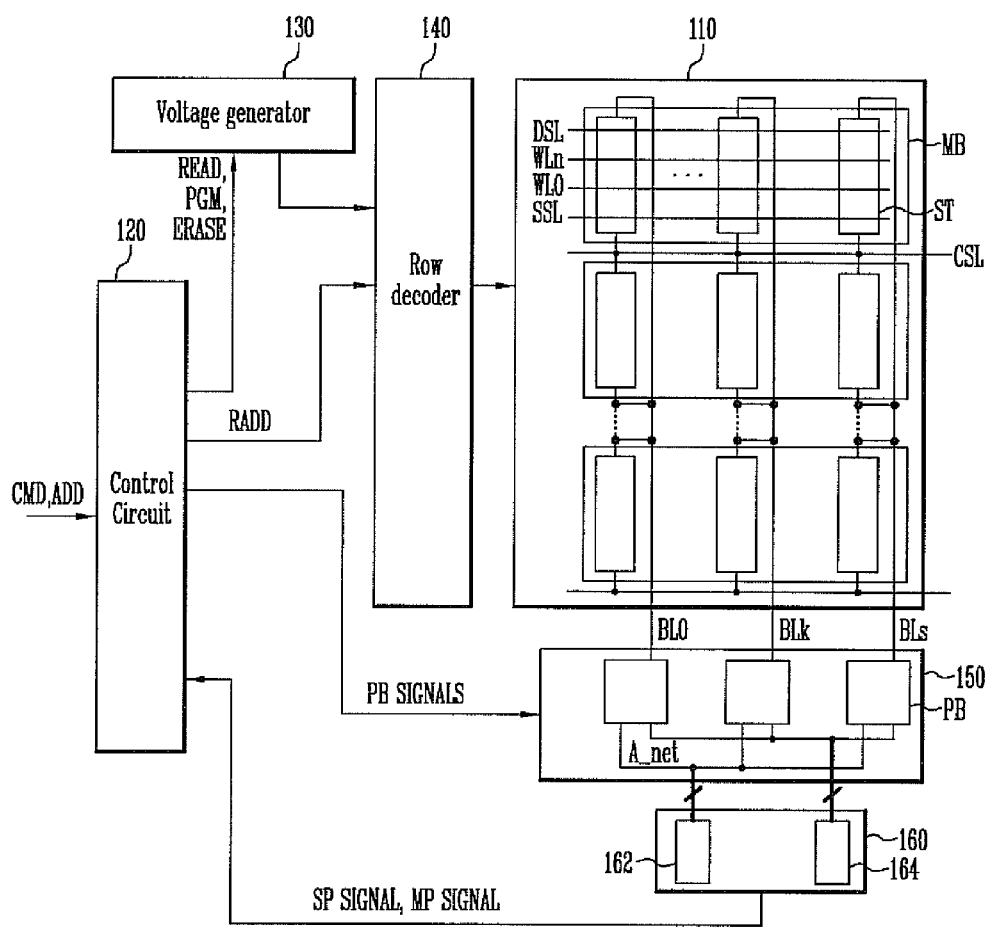
FIG. 1 is a diagram illustrating a semiconductor memory device according to an exemplary embodiment of this disclosure.

FIG. 1 is a diagram illustrating a semiconductor memory device according to an exemplary embodiment of this disclosure.

Referring to FIG. 1, the semiconductor memory device includes a memory cell array 110, a control circuit 120, a voltage generator 130, a row decoder 140, a page buffer group 150, and a check circuit group 160.

The memory cell array 110 includes a plurality of memory cell blocks MB. Each of the memory cell blocks MB includes strings ST coupled to bit lines. That is, the strings ST are coupled to the respective bit lines and coupled in parallel to a common source line CSL. More particularly, each of the strings ST includes a drain select transistor (not shown) coupled to the bit line, a source select transistor (not shown) coupled to the common source line CSL, and memory cells (not shown) coupled in series between the drain select transistor and the source select transistor. The gates of the drain select transistors of the strings ST are interconnected to form a drain select line DSL, and the gates of the source select transistors of the strings ST are interconnected to form a source select line SSL. Furthermore, the control gates of the memory cells of the strings ST are interconnected to form word lines WL0, ..., WLn. The memory cells coupled to one word line may defined a page. Furthermore, even-numbered memory cells and odd-numbered memory cells, from among the memory cells coupled to one word line may be classified into different pages.

The control circuit 120 generates one of a program signal PGM, a read signal READ, and an erase signal ERASE for determining the operations of the memory cells in response to a command signal CMD and also generates a control signal PB SIGNALS for page buffers PB so that the page buffers PB can be operated in response to the operations of the memory cells determined by the control circuit 120. Furthermore, the control circuit 120 generates a row address signal RADD and a column address signal CADD in response to an address signal ADD.

The voltage generator 130 generates operating voltages for the operations of the memory cells determined by the control circuit 120. For example, in the case of a program operation, the voltage generator 130 generates a program voltage, a program pass voltage, and verification voltages. In particular, the voltage generator 130 may generate a sub-verification voltage and a target verification voltage for a double verification operation.

The row decoder 140 transfers the operating voltages, received from the voltage generator 130, to the select lines DSL, SSL and the word lines WL0, . . . , WLn of a selected memory cell block MB in response to the row address signal RADD of the control circuit 130.

The page buffer group 150 includes the plurality of page buffers PB. The page buffers PB are coupled to the respective bit lines BL0 to BLs. The page buffers PB latch data to be stored in the memory cells of a page selected in a selected memory cell block. In particular, after a program operation is performed on selected memory cells in order to store data, each of the page buffers is configured to latch a first data (i.e., a result of the comparison of the threshold voltage of a memory cell with the sub-verification voltage) and a second data (i.e., a result of the comparison of the threshold voltage of the memory cell with the target verification voltage). This is described below in detail.

The check circuit group 160 outputs a result of the comparison of all the threshold voltages of selected memory cells with the sub-verification voltage or the target verification voltage as a pass/failure signal in response to the first data or the second data latched in the page buffers PB.

A detailed circuit configuration and operation of the page buffer PB and the check circuit group 160 are described below.

Figure 2:
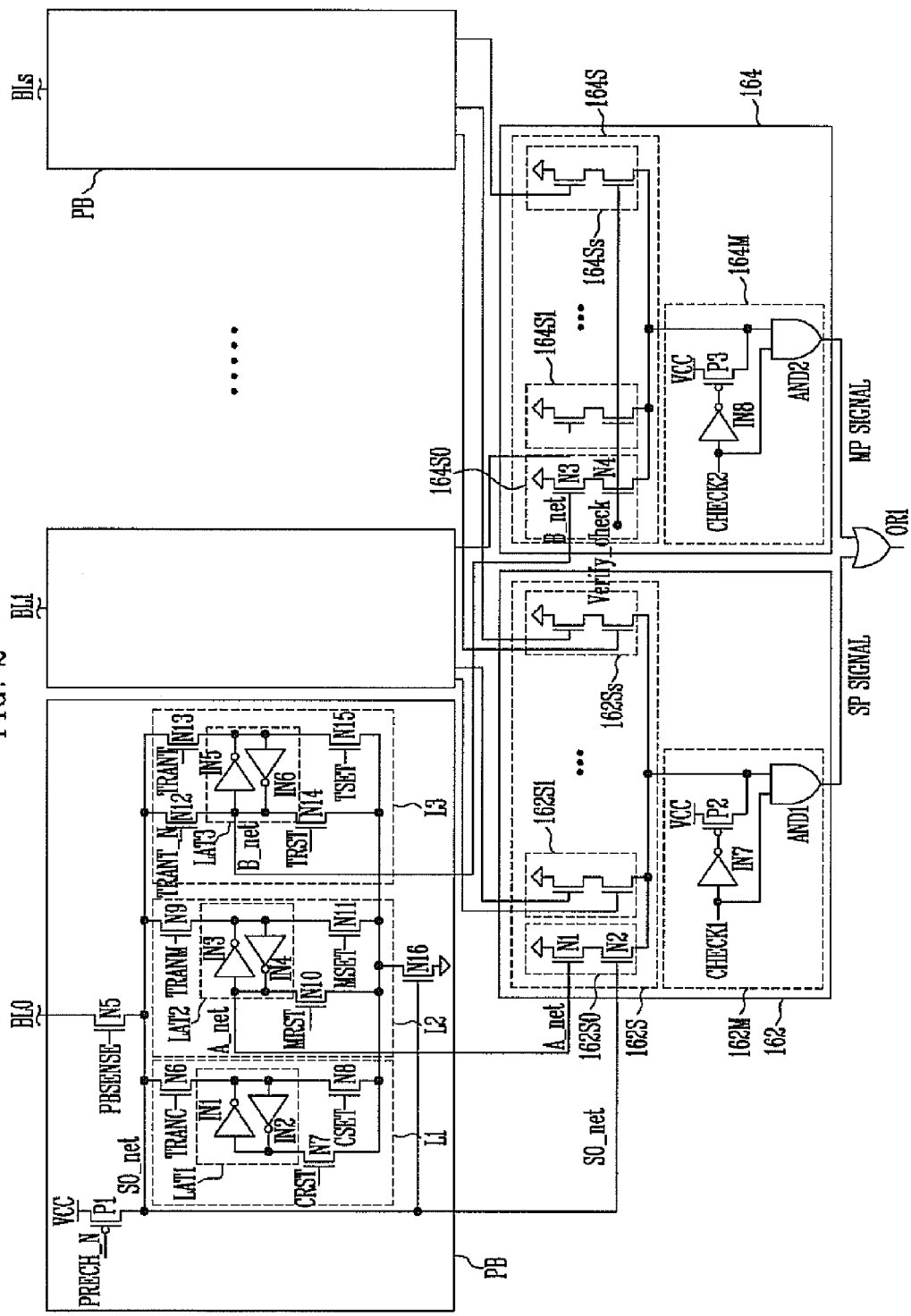
FIG. 2 is a circuit diagram of the semiconductor memory device according to an exemplary embodiment of this disclosure.

FIG. 2 is a circuit diagram of the semiconductor memory device shown FIG. 1.

Referring to FIG. 2, the page buffer PB includes a plurality of latch circuits L1, L2, and L3 coupled to a sense node SO_net, a precharge circuit P1 configured to precharge the sense node SO_net in response to a precharge enable signal PRECH_N, a connection circuit N5 configured to couple a bit line BL0 with the sense node SO_net in response a sense signal PBSENSE, and a sense circuit N16 configured to change data latched in the latch circuits L1, L2, and L3 according to the potential on the sense node SO_net.

The first latch circuit L1 includes a first latch LAT1, a transmission circuit N6, a set circuit N8, and a reset circuit N7. The first latch LAT1 is formed of first and second inverters IN1 and IN2 in order to latch data. The transmission circuit N6 is coupled between the sense node SO_net and the input node of the first latch LAT1 and operated in response to a transmission signal TRANC. The set circuit N8 is coupled between the sense circuit N16 and the input node of the first latch LAT1 and operated in response to a set signal CSET. The reset circuit N7 is coupled between the sense circuit N16 and the output node of the first latch LAT1 and operated in response to a reset signal CRST.

Each of the second and third latch circuits L2 and L3 may have the same elements as the first latch circuit L1. Here, the third latch circuit L3 may further include a transmission circuit N12 coupled between the sense node SO_net and the output node of a third latch LAT3 and operated in response to another transmission signal TRANT_N. The transmission circuit N12 may be used when data stored in the latch of another latch circuit is stored in the latch LAT3 or when data stored in the latch LAT3 is transferred to the latch of another latch circuit.

Meanwhile, in a double verification operation performed using the sub-verification voltage and the target verification voltage after a program operation, the first and the second data corresponding to verification results may be stored in the respective latches LAT2 and LAT3 of the second and third latch circuits L2 and L3. Furthermore, the first latch circuit L1 may be used to latch data to be stored in a memory cell.

The check circuit group 160 includes a sub-pass check circuit 162 and a main pass check circuit 164.

The sub-pass check circuit 162 includes a parallel pass check circuit 162S and a common pass check circuit 162M. The parallel pass check circuit 162S includes check circuits 162S0 to 162Ss corresponding to the respective page buffers PB. Each of the check circuits 162S0 to 162Ss outputs a first pass signal in response to a first sub-check enable signal and the first data, which is outputted from the output node A_net of the latch LAT2 included in the second latch circuit L2 of the corresponding page buffer PB. For example, the check circuit 162S0 includes a first switching element N1 and a second switching element N2. The first switching element N1 has one terminal coupled to a ground terminal and operates in response to the first data latched in the second latch LAT2 of the page buffer PB. The second switching element N2 is coupled to the other terminal of the first switching element N1 and operated in response to the first sub-check enable signal. The other terminals of the second switching elements N2 of the check circuits 162S0 to 162Ss are commonly coupled to the output terminal of the parallel pass check circuit 162S.

Here, the first sub-check enable signal is activated according to the potential on the sense node SO_net. The potential on the sense node SO_net is determined in response to the precharge signal PRECH_N. Thus, when the precharge signal PRECH_N is activated, the first sub-check enable signal is activated. Accordingly, the precharge signal PRECH_N may correspond to the first sub-check enable signal.

The parallel pass check circuit 162S outputs the first pass signal of a low logic level through its output terminal when the first sub-check enable signal SO_net of a high logic level is received and any one of the first data of a high logic level on node A_net of the page buffers PB is received. The first data of the high logic level may be received in a case where the threshold voltage of the memory cell is lower than the sub-verification voltage. On the other hand, in a case where all the threshold voltages of the selected memory cells are higher than the sub-verification voltage, all the first data become a low logic level, and so the output terminal of the parallel pass check circuit 162S becomes a floating state. That is, the parallel pass check circuit 162S does not output the first pass signal.

The common pass check circuit 162M includes an AND gate AND1 and voltage supply circuits IN7 and P2. The AND gate AND1 has a first input terminal to which a second sub-check enable signal CHECK1 is inputted and a second input terminal to which the output terminal of the parallel pass check circuit 162S is coupled. The voltage supply circuit IN7 and P2 supply a power source voltage VCC to the second input terminal of the AND gate AND1 in response to the second sub-check enable signal CHECK1 when the output terminal of the parallel pass check circuit 162S is in a floating state.

The common pass check circuit 162M outputs a sub-pass signal SP SIGNAL unless the first pass signal is outputted (that is, if all the threshold voltages of selected memory cells are higher than the sub-verification voltage). The sub-pass signal SP SIGNAL is activated in a high level and outputted.

The main pass check circuit 164 has the same construction as the sub-pass check circuit 162 except that each check circuit of a parallel pass check circuit 164S is operated in response to the second data stored in the latch LAT3 of the third latch circuit L3 and a first main check enable signal Verify_check. Furthermore, a common pass check circuit 164M is operated in response to a second main check enable signal which is activated after a verification operation using a main verification voltage.

The main pass check circuit 164 activates a main pass signal MP SIGNAL (e.g., the main pass signal has a high logic level) when all the threshold voltages of selected memory cells are higher than a target verification voltage.

The sub-pass signal SP SIGNAL or the main pass signal MP SIGNAL may be inputted to a control circuit via an output buffer, such as an OR gate OR1. However, the sub-pass signal SP SIGNAL or the main pass signal MP SIGNAL may be directly inputted to the control circuit. The control circuit controls whether to perform a verification operation using a sub-verification voltage PV1' or a verification operation using a target verification voltage PV1 in response to the sub-pass signal SP SIGNAL or the main pass signal MP SIGNAL.

Hereinafter, the operation of the semiconductor memory device is described.

Figure 3:
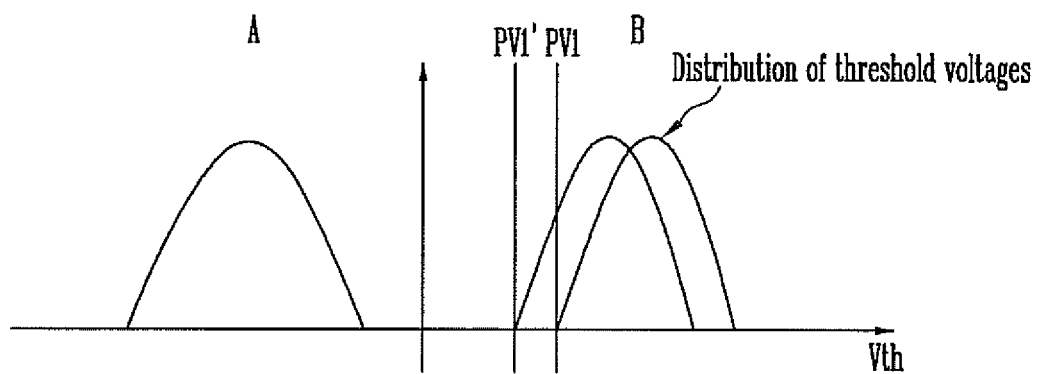
FIG. 3 is a diagram illustrating a program method of the semiconductor memory device according to an exemplary embodiment of this disclosure.

FIG. 3 is a diagram illustrating a program method of the semiconductor memory device according to an exemplary embodiment of this disclosure.

Referring to FIG. 3, in a case where memory cells having threshold voltages distributed in a first level A are sought to be raised up to a second level B, a program voltage is supplied to the word line of the memory cells. Next, the sub-verification voltage PV1' is supplied to the word line and the threshold voltages of the memory cells are then detected. Next, the target verification voltage PV1 is supplied to the word line and the threshold voltages of the memory cells are then detected. Next, the program operation is performed again by supplying a voltage of 0 V to a bit line coupled to memory cells having a threshold voltage level lower than the sub-verification voltage PV1', supplying a voltage higher than 0 V and lower than a program-inhibition voltage (for example, Vcc) to a bit line coupled to memory cells having threshold voltages higher than the sub-verification voltage PV1' and lower than the target verification voltage PV1, and supplying the program-inhibition voltage to a bit line coupled to memory cells having threshold voltages higher than the target verification voltage PV1. Here, the program operation is performed again with a raised program voltage. That is, whenever the program operation is performed, the program voltage is raised by a certain level. Next, first and second verification operations using the sub-verification voltage PV1' and the target verification voltage PV1, respectively, are performed again.

Here, whether or not to perform a first verification operation and a second verification operation is determined according to the threshold voltages of the memory cells. This determination is described in more detail below.

Figure 4:
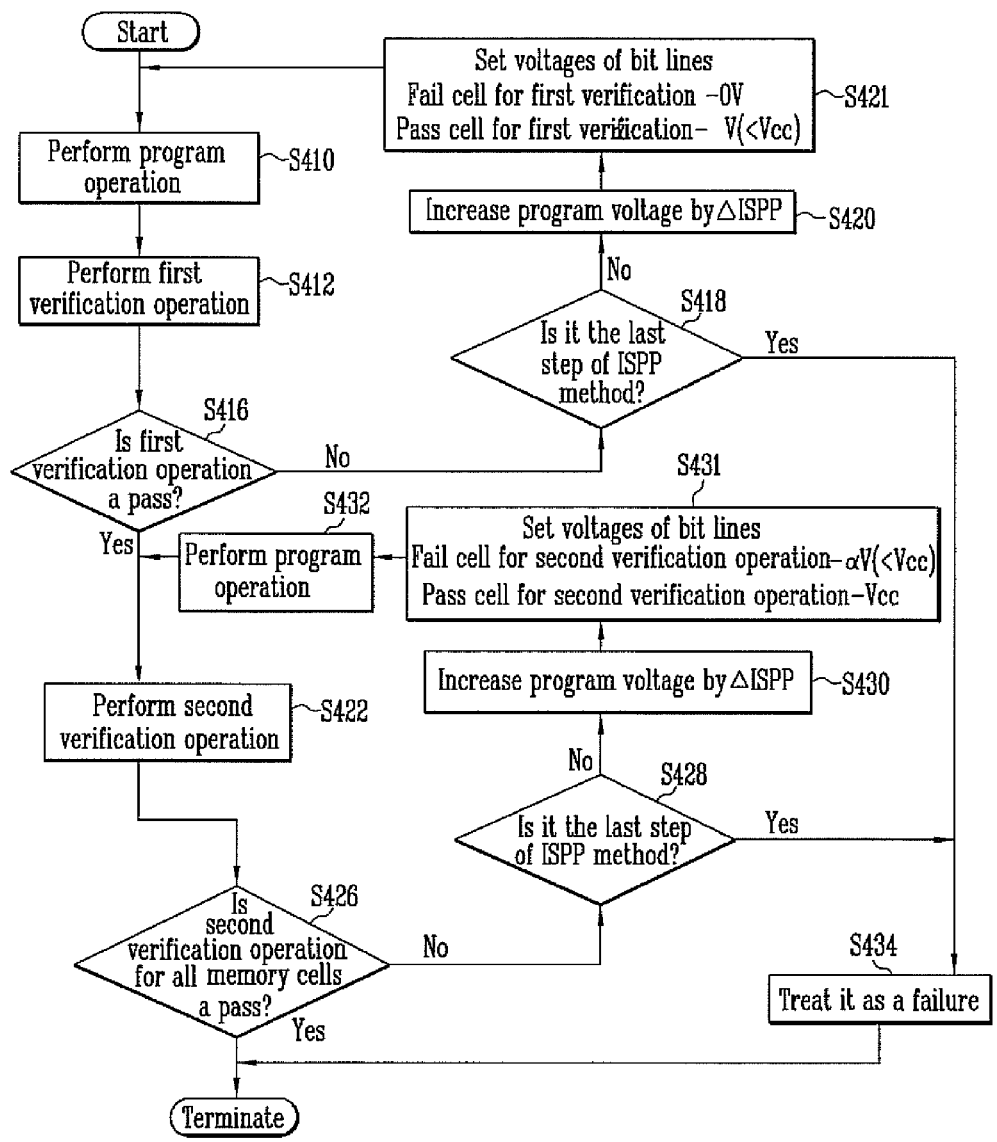
FIG. 4 is a flowchart illustrating the program method of the semiconductor memory device according to an exemplary embodiment of this disclosure.

FIG. 4 is a flowchart illustrating the program method of the semiconductor memory device according to an exemplary embodiment of this disclosure.

Referring to FIGS. 2 and 4, a program operation is performed by supplying a program voltage to the word line of selected memory cells at step S410. For the program operation, data to be stored in the selected memory cells is latched in the first latch circuit L1, and the second and third latch circuits L2 and L3 are reset. For example, the sense node SO_net is precharged by the precharge circuit P1, thereby turning on the sense circuit N16 and turning on the set circuits N11 and N15. Accordingly, the ground voltage is transferred to the input nodes of the second and third latches LAT2 and LAT3. Consequently, the second and third latches LAT2 and LAT3 output a voltage of a high level to the respective output nodes A_net and B_net. Next, the ground voltage is supplied to the bit line BL of the selected memory cells according to data stored in the latch LAT1 of the first latch circuit L1. Next, the program voltage is supplied to the word line of the selected memory cells, and the program pass voltage is supplied to the other word lines.

After the program operation is performed, the first verification operation is performed by supplying the sub-verification voltage PV1' to the word line at step S412. When the threshold voltages of the selected memory cells are lower than the sub-verification voltage, a voltage of the bit line BL is lowered. Accordingly, the connection circuit N5 is turned on, and so a voltage of the sense node SO_net is also lowered. Since the sense circuit N16 is turned off by the voltage of the sense node SO_net, data stored in the latch LAT2 of the second latch circuit L2 is maintained although the reset circuit N10 is turned on.

Meanwhile, when the threshold voltages of the selected memory cells are higher than the sub-verification voltage, a voltage of the bit line BL0 is maintained at a high level. Accordingly, the connection circuit N5 is turned on, and so a voltage of the sense node SO_net also maintains a high level. When the sense circuit N16 is turned on by the voltage of the sense node SO_net and the reset circuit N10 is turned on in response to the reset signal MRST, the data stored in the latch LAT2 of the second latch circuit L2 is changed. That is, a signal of a low level is outputted to the output node of the latch LAT2.

It is then determined whether a result of the first verification operation is a pass or failure by detecting all the threshold voltages of the selected memory cells at step S416.

If there is any memory cell having a threshold voltage lower than the sub-verification voltage PV1', from among the selected memory cells, a corresponding circuit of the check circuits 162S0 to 162Ss is operated. In this case, the ground voltage is supplied to the second input terminal of the AND gate AND1 of the common pass check circuit 162M, and the common pass check circuit 162M outputs the sub-pass signal SP SIGNAL of a low logic level, informing the verification failure. Next, the second verification operation using the target verification voltage PV1 is not performed.

It is determined whether the number of program operations executed is an allowed maximum number in response to the sub-pass signal SP SIGNAL of a low logic level (that is, the program operation is the last step of the ISPP method) at step S418. If, as a result of the determination at step 418, the number of program operations executed is determined to be the allowed maximum number, the program operation is no longer performed and treated as a failure at step S434. If, as a result of the determination at step S418, the number of program operations executed is determined not to be the allowed maximum number, the control circuit raises the program voltage by a step voltage (ΔISPP) at step S420 and sets the voltage of the bit lines again at step S421. For example, a voltage of 0 V may be supplied to a bit line coupled to memory cells having threshold voltages lower than the sub-verification voltage PV1', from among the selected memory cells. Furthermore, a voltage higher than 0 V and lower than a program-inhibition voltage (for example, Vcc) may be supplied to a bit line coupled to memory cells having threshold voltages higher than the sub-verification voltage PV1', from among the selected memory cells. Next, the process returns to step S410 where the program operation is performed again.

Meanwhile, if, as a result of the determination at step S416, all the threshold voltages of the selected memory cells are higher than the sub-verification voltage PV1', the result of the first verification operation is determined to be a pass and the sub-pass signal SP SIGNAL of a high logic level is outputted. The first verification operation using the sub-verification voltage PV1' is no longer performed.

That is, the second verification operation using the target verification voltage PV1 is performed at step S422. As in the first verification operation, data stored in the latch LAT3 of the third latch circuit L3 is changed depending on whether the threshold voltages of the selected memory cells are higher or lower than the target verification voltage PV1.

It is then determined whether a result of the second verification operation is a pass or failure by detecting all the threshold voltages of the selected memory cells at step S426.

If there is any memory cell having a threshold voltage lower than the target verification voltage PV1, from among the selected memory cells, a corresponding circuit of the check circuits 164S0 to 164Ss of the main pass check circuit 164 is operated as in steps S416. Accordingly, the common pass check circuit 164M outputs the main pass signal MP SIGNAL of a low logic level, informing the verification failure.

Responding to the main pass signal MP SIGNAL of a low logic level, a step S428 of checking the number of program operations executed, a step S430 of raising the program voltage, and a step S431 of setting a voltage of the bit lines are performed as in steps S418, S420, and S421. At step S431, a voltage higher than 0 V and lower than a program-inhibition voltage (for example, Vcc) may be supplied to a bit line coupled to memory cells having threshold voltages higher than the sub-verification voltage PV1' and lower than the target verification voltage PV1, from among the selected memory cells. Furthermore, the program-inhibition voltage may be supplied to a bit line coupled to memory cells having threshold voltages higher than the target verification voltage PV1, from among the selected memory cells. Next, the program operation is performed again at step S432.

When the main pass signal MP SIGNAL of a high logic level is outputted, it means that all the threshold voltages of the selected memory cells are higher than the target verification voltage PV1. Accordingly, the entire program operation is terminated.

In the program method of the semiconductor memory device according to an exemplary embodiment of this disclosure, in a double verification operation performed after a program operation, either the verification operation using the sub-verification voltage PV1' or the verification operation using the target verification voltage PV1 is performed. Accordingly, the number of verification operations can be reduced, and so the time taken to perform the entire program operation for storing data can be reduced.

Figure 5:
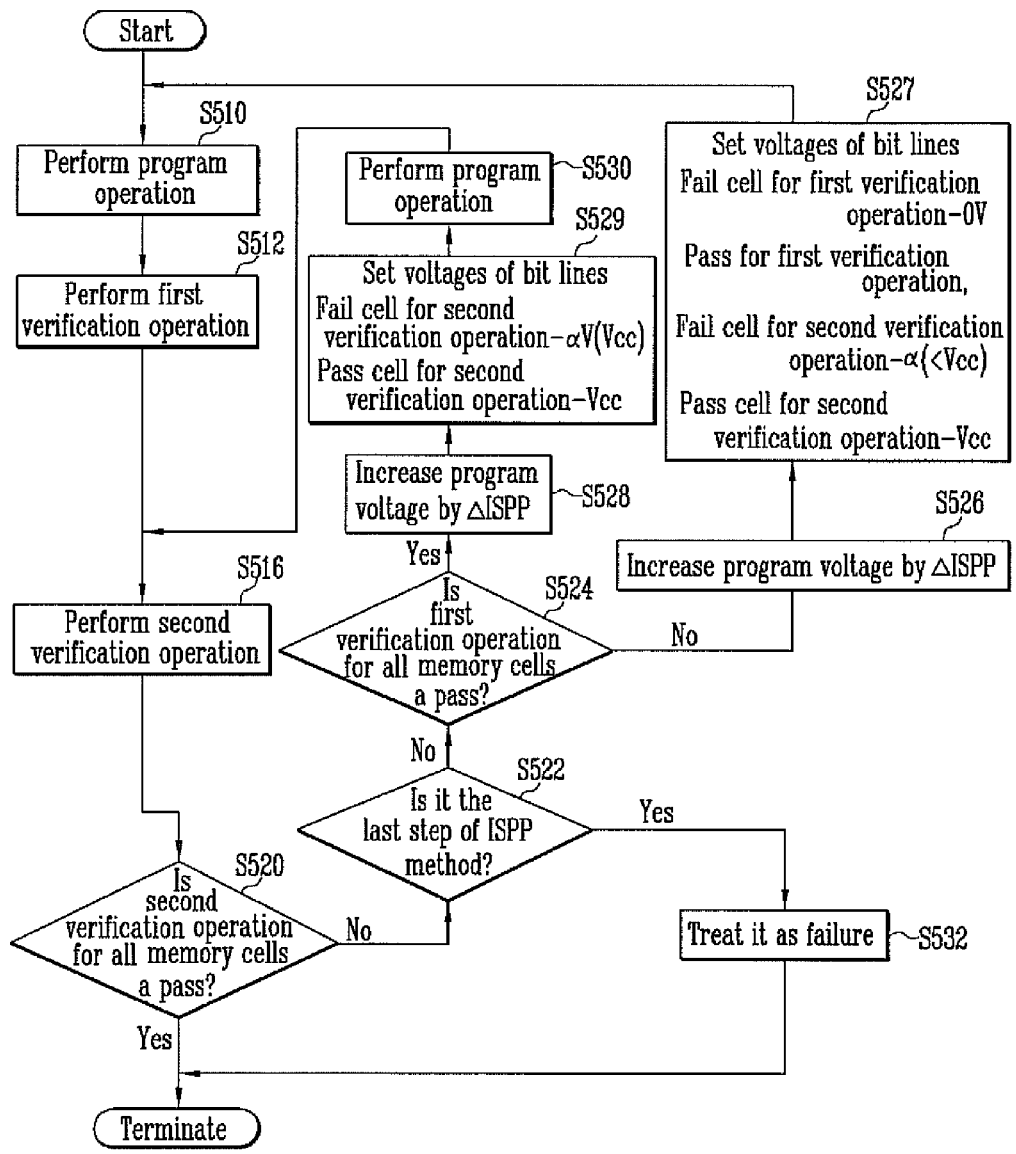
FIG. 5 is a flowchart illustrating a program method of the semiconductor memory device according to another exemplary embodiment of this disclosure.

FIG. 5 is a flowchart illustrating a program method of the semiconductor memory device according to another exemplary embodiment of this disclosure.

Referring to FIGS. 2 and 5, a program operation is performed by supplying a program voltage to the word line of selected memory cells at step S510. For the program operation, data to be stored in the selected memory cells is stored in the first latch circuit L1, and the second and third latch circuits L2 and L3 are reset. This may be performed as described with reference to FIG. 4A, and a detailed description thereof is omitted.

Next, the first verification operation using the sub-verification voltage PV1' is performed at step S512. The step S512 is performed in the same manner as the step S412 described with reference to FIG. 4, and a detailed description thereof is omitted.

Next, the second verification operation using the target verification voltage PV1 is performed at step S516. It is then determined whether a result of the second verification operation is a pass or a failure at step S520. The steps S516 and S520 are performed in the same manner as the steps S422 and S426 described with reference to FIG. 4, and a detailed description thereof is omitted.

If, as a result of the determination at step S520, there is any memory cell having a threshold voltage lower than the target verification voltage PV1, from among the selected memory cells, it is determined whether the number of program operations executed is an allowed maximum number (that is, the program operation is the last step of the ISPP method) at step S522. If, as a result of the determination at step S522, the number of program operations executed is determined to be the allowed maximum number, the program operation is no longer performed and treated as a failure at step S532.

Meanwhile, if, as a result of the determination at step S522, the number of program operations executed is determined not to be the allowed maximum number, it is determined whether all the threshold voltages of the selected memory cells are higher than the sub-verification voltage PV1' at step S524.

If, as a result of the determination at step S524, there is any memory cell having a threshold voltage lower than the sub-verification voltage PV1', from among the selected memory cells, the control circuit raises the program voltage by a step voltage ($\Delta$ISPP) at step S526 and sets voltages of the bit lines again at step S527. For example, a voltage of 0 V may be supplied to a bit line coupled to memory cells having threshold voltages lower than the sub-verification voltage PV1', from among the selected memory cells. A voltage higher than 0 V and lower than a program-inhibition voltage (for example, Vcc) may be supplied to a bit line coupled to memory cells having threshold voltages higher than the sub-verification voltage PV1' and lower than the target verification voltage PV1, from among the selected memory cells. Furthermore, the program-inhibition voltage Vcc may be supplied to a bit line coupled to memory cells having threshold voltages higher than the target verification voltage PV1. Next, the process returns to step S510 where the program operation is performed again.

Meanwhile, if, as a result of the determination at step S524, all the threshold voltages of the selected memory cells are determined to be higher than the sub-verification voltage PV1', the control circuit raises the program voltage by a step voltage ($\Delta$ISPP) at step S528 and sets voltages of the bit lines again at step S529. For example, a voltage higher than 0 V and lower than a program-inhibition voltage (for example, Vcc) may be supplied to a bit line coupled to memory cells having threshold voltages higher than the sub-verification voltage PV1' and lower than the target verification voltage PV1, and the program-inhibition voltage Vcc may be supplied to a bit line coupled to memory cells having threshold voltages higher than the target verification voltage PV1. Next, the program operation is performed again at step S530. Next, the steps of performing the first verification operation and checking whether the first verification operation is a pass or failure are no longer performed, and only the step S516 of performing the second verification operation and the step S520 of determining whether the second verification operation is a pass or failure are performed.

The above steps are terminated when all the threshold voltages of the selected memory cells are higher than the target verification voltage PV1.

In the program method of the semiconductor memory device according to another exemplary embodiment of this disclosure, in a double verification operation performed after a program operation, when the first verification operation using the sub-verification voltage PV1' is unnecessary, only the second verification operation using the target verification voltage PV1 is performed. Accordingly, the number of verification operations can be reduced, thereby reducing the time taken to perform the entire program operation for storing data. Furthermore, a rising/shifting level of threshold voltages can be controlled more accurately.

In accordance with the exemplary embodiments of this disclosure, verification operations performed after a program operation of selected memory cells are selectively performed according to the threshold voltages of the memory cells. Accordingly, the program time can be reduced.

What is claimed is:

1. A semiconductor memory device, comprising:
    a memory cell array configured to comprise a plurality of memory cells;
    a voltage generator configured to supply a program voltage, a sub-verification voltage, or a target verification voltage to the memory cells selected during a program operation, the target verification voltage being the lowest acceptable voltage in a target threshold distribution, the sub-verification voltage being lower than the target verification voltage;
    page buffers configured to latch first data according to results from comparing threshold voltages of the selected memory cells with the sub-verification voltage and latch second data according to results from comparing the threshold voltages of the memory cells with the target verification voltage;
    a sub-pass check circuit configured to output a sub-pass signal in response to the first data outputted from the page buffers;
    a main pass check circuit configured to output a main pass signal in response to the second data outputted from the page buffers; and
    a control circuit configured to control whether or not the voltage generator supplies the sub-verification voltage and the target verification voltage in response to the sub-pass signal and the main pass signal,
    wherein the sub-verification voltage is supplied and the target verification voltage is not supplied in response to the sub pass signal which is a first level, and the sub-verification voltage is not supplied and the target verification voltage is supplied in response to the sub pass signal which is a second level.

2. The semiconductor memory device of claim 1, wherein the sub-pass check circuit comprises:
    a parallel pass check circuit configured to output pass signals in response to a first sub-check enable signal and the first data of the page buffers; and
    a common pass check circuit configured to output the sub-pass signal in response to the pass signals and a second sub-check enable signal.

3. The semiconductor memory device of claim 2, wherein the parallel pass check circuit comprises a plurality of check circuits corresponding to the page buffers, each check circuit comprising:
    a first switching element configured to have one terminal coupled to a ground terminal and operate in response to one of the first data of the page buffers; and
    a second switching element coupled to the other terminal of the first switching element and configured to operate in response to the first sub-check enable signal,
    wherein the other terminals of the second switching elements of the check circuits are interconnected.

4. The semiconductor memory device of claim 2, wherein the common pass check circuit comprises:
    an AND gate configured to have a first input terminal to which the second sub-check enable signal is inputted and a second input terminal to which the pass signals are inputted; and
    a voltage supply circuit configured to supply a power source voltage to the second input terminal in response to the second sub-check enable signal when the pass signals are in a floating state.

5. The semiconductor memory device of claim 1, wherein the main pass check circuit comprises:
    a parallel pass check circuit configured to output pass signals in response to a first main check enable signal and the second data of the page buffers; and
    a common pass check circuit configured to output the main pass signal in response to the pass signals and a second main check enable signal.

6. The semiconductor memory device of claim 5, wherein the parallel pass check circuit comprises a plurality of check circuits corresponding to the page buffers, each check circuit comprising:
    a first switching element configured to have one terminal coupled to a ground terminal and operate in response to one of the second data of the page buffers; and
    a second switching element coupled to the other terminal of the first switching element and configured to operate in response to the first main check enable signal,
    wherein the other terminals of the second switching elements of the check circuits are interconnected.

7. The semiconductor memory device of claim 5, wherein the common pass check circuit comprises:
    an AND gate configured to have a first input terminal to which the second main check enable signal is inputted and a second input terminal to which the pass signals are inputted; and
    a voltage supply circuit configured to supply a power source voltage to the second input terminal in response to the second main check enable signal when the pass signals are in a floating state.

8. A method of programming a semiconductor memory device, comprising:
    performing a first program operation to shift threshold voltages of memory cells selected from among a group of memory cells;
    performing a first verification operation for comparing the threshold voltages of the selected memory cells with a sub-verification voltage and a second verification operation for comparing the threshold voltages with a target verification voltage;
    if there is a memory cell having a threshold voltage lower than the sub-verification voltage, from among the selected memory cells, performing a second program operation and the first verification operation to shift the threshold voltages of the selected memory cells, the second verification operation being omitted; and
    after all the threshold voltages of the selected memory cells become higher than the sub-verification voltage, if there is a memory cell having a threshold voltage lower than the target verification voltage, performing a third program operation and the second verification operation to shift threshold voltages of memory cells having lower than the target verification voltage, the first verification operation being omitted, wherein the target verification voltage is the lowest acceptable voltage in a target threshold distribution and the sub-verification voltage is lower than the target verification voltage.

9. The method of claim 8, wherein, if there is a memory cell, having a threshold voltage lower than the sub-verification voltage after the first and second verification operations, from among the selected memory cells, the supplying of the voltage comprises: supplying a voltage of 0 V to a bit line coupled to memory cells, having threshold voltages lower than the sub-verification voltage, from among the selected memory cells, supplying a voltage ranging from 0 V to a program-inhibition voltage to a bit line coupled to memory cells, having threshold voltages higher than the sub-verification voltage and lower than the target verification voltage, from among the selected memory cells, and supplying the program-inhibition voltage to a bit line coupled to memory cells, having threshold voltages higher than the target verification voltage, from among the selected memory cells.

10. The method of claim 8, wherein, if there is a memory cell, having a threshold voltage lower than the target verification voltage, but all threshold voltages of the selected memory cells are higher than the sub-verification voltage after the first and second verification operations, from among the selected memory cells, the supplying of the voltage comprises:

supplying a voltage ranging from 0 V to a program-inhibition voltage to a bit line coupled to memory cells, having threshold voltages higher than the sub-verification voltage and lower than the target verification voltage, from among the selected memory cells, and supplying the program-inhibition voltage to a bit line coupled to memory cells, having threshold voltages higher than the target verification voltage, from among the selected memory cells.

11. The method of claim 8, wherein if there is a memory cell having a threshold voltage lower than the sub-verification voltage, from among the selected memory cells, the second program operation and the first verification operation are repeatedly performed while raising a program voltage supplied to the selected memory cells.

12. The method of claim 8, wherein if, after all the threshold voltages of the selected memory cells become higher than the sub-verification voltage, there is a memory cell having a threshold voltage lower than the target verification voltage, from among the selected memory cells, the third program operation and the second verification operation are repeatedly performed while raising a program voltage supplied to the selected memory cells until all the threshold voltages of the selected memory cells are determined to be higher than the target verification voltage by the second verification operation.

13. The method of claim 8, wherein, if all threshold voltages of the selected memory cells are higher than the target verification voltage after the first and second verification operations, the program operation is terminated.

* * * * *

UNITED STATES PATENT AND TRADEMARK OFFICE
CERTIFICATE OF CORRECTION

PATENT NO. : 8,625,354 B2  Page 1 of 1
APPLICATION NO. : 12/982558
DATED : January 7, 2014
INVENTOR(S) : Ka Young Cho et al.

It is certified that error appears in the above-identified patent and that said Letters Patent is hereby corrected as shown below:

Title page

The Inventors section should read as follows:

Item (75)   Inventors:   Ka Young CHO, Chungcheoungbuk-do
                         (KR); Young Soo Park, Seoul (KR)

The Assignee section should read as follows:

Item (73)   Assignee:   Hynix Semiconductor Inc.,
                        Gyeonggi-do (KR)

Signed and Sealed this
Fourth Day of March, 2014

Michelle K. Lee
*Deputy Director of the United States Patent and Trademark Office*